(12) United States Patent
Jones et al.

(10) Patent No.: US 7,517,810 B2
(45) Date of Patent: Apr. 14, 2009

(54) REDUCED METAL DESIGN RULES FOR POWER DEVICES

(75) Inventors: David Paul Jones, South Glamorgan (GB); Hugo R. G. Burke, Wales (GB)

(73) Assignee: International Rectifier Corporation, El Segundo, CA (US)

( * ) Notice: Subject to any disclaimer, the term of this patent is extended or adjusted under 35 U.S.C. 154(b) by 238 days.

(21) Appl. No.: 11/441,843

(22) Filed: May 26, 2006

(65) Prior Publication Data

US 2006/0270207 A1 Nov. 30, 2006

Related U.S. Application Data

(60) Provisional application No. 60/685,179, filed on May 27, 2005.

(51) Int. Cl.
*H01L 21/302* (2006.01)
(52) U.S. Cl. .............. 438/754; 438/720; 438/751; 216/77
(58) Field of Classification Search .......... 438/584, 438/706, 710, 720, 745, 754, 750, 751; 216/77, 216/100
See application file for complete search history.

(56) References Cited

U.S. PATENT DOCUMENTS

| 4,906,592 A | * | 3/1990 | Merenda et al. ............. 438/624 |
| 6,077,789 A | * | 6/2000 | Huang ......................... 438/720 |
| 7,314,813 B2 | * | 1/2008 | Su et al. ...................... 438/584 |

* cited by examiner

*Primary Examiner*—Lan Vinh
(74) *Attorney, Agent, or Firm*—Ostrolenk, Faber, Gerb & Soffen, LLP

(57) ABSTRACT

A process for etching a thick aluminum contact layer of a semiconductor wafer comprises the formation of a wet etch photoresist mask and the opening of a window in the mask, followed by a wet etch of a first portion of the thickness of the contact layer exposed by the window and the inherent under cutting of the contact layer under the mask window. A dry etch is next carried out, using the same window as a mask, to cut the remaining web of the contact layer under the window. An etch stop layer of Ti or TiN can be formed within the body of the contact layer to define the depth of the initial wet etch into the contact layer.

11 Claims, 3 Drawing Sheets

US 7,517,810 B2

REDUCED METAL DESIGN RULES FOR POWER DEVICES

RELATED APPLICATIONS

This application claims the benefit and priority of U.S. Provisional Application No. 60/685,179, filed May 27, 2005 the entire disclosure of which is incorporated by reference herein.

FIELD OF THE INVENTION

This invention relates to semiconductor devices and more specifically relates to novel processes for etching thick metal layers.

BACKGROUND OF THE INVENTION

Semiconductor devices, such as discrete power MOSFETs typically use thick metal films (eg. 8μ of Aluminum or other suitable metal) in order to carry the large currents which may be associated with these devices. In order to etch such thick films it is normal to use wet etch, as dry etching has many problems. Thus:

a) Dry etching requires an extremely thick resist. That is, aluminum to resist selectivity is normally low except for the latest generation, and extremely expensive etchers. Further, a very thick resist has an unrealistically long exposure time on steppers and has poor resolution.

b) The use of dry etching is very costly due to the very low throughput as dry metal etch rates are not very high.

c) Any silicon nodules in an aluminum layer will etch more slowly than the aluminum. With thick aluminum films, this can cause pillars of unetched Al remaining after the etch process.

A serious disadvantage of wet etching is that, unlike dry etching, it is isotropic (ie. it etches laterally as well as vertically). (See FIGS. 1 to 3.) This means that the Aluminum has to be formed with a very large overlap of the contacts, to ensure that the Aluminum is not etched away from over the contacts which would be a reliability concern. Due to the large overetch normally used, an overlap of, say, 16 μm is common with an 8 μm thick film for aluminum on a silicon wafer. This large overlap wastes a lot of silicon area. As silicon performance is increasing and die are shrinking, this wasted silicon area is becoming a larger percentage of the ultimate die singulated from the wafer.

BRIEF DESCRIPTION OF THE INVENTION

In accordance with the invention, the thick metal layer, typically aluminum, is initially wet etched for a given percentage of its thickness eg. 80% leaving a thin web at the bottom of the thick metal layer. The photoresist mask is left in place, and the remaining metal (web) is then dry etched in the area defined by the initial mask. This dual stage approach ensures that edge of the final thick metal lines up with the resist. This means the overlap can be reduced from about 16 μm to a much smaller value. Because only a thin layer or web of metal such as aluminum is being dry etched, the process has none of the disadvantages mentioned above for dry etching. Further, if there is a barrier layer under the aluminum, it can be dry etched at the same time, so there is no cost penalty.

In a second embodiment of the invention, and in order to more accurately control the amount of aluminum wet etched versus dry etched, a wet etch 'stop' layer, for example, a titanium layer or the like can be added part way through the thick aluminum thickness. In one example, the thick aluminum layer could be 1 μm of Al, coated with 100 Å to 1000 Å Ti or TiN followed by 7 μm Al. The wet etch process will stop on the Ti or TiN stop layer and not etch further. The subsequent dry etch process will then etch both the stop layer and the underlying Aluminum in an area defined by the photoresist mask.

The process of the invention allows the metal overlap of the contact to be significantly reduced without impacting reliability and at minimum cost.

DETAILED DESCRIPTION OF THE PREFERRED EMBODIMENT

Figure 1:
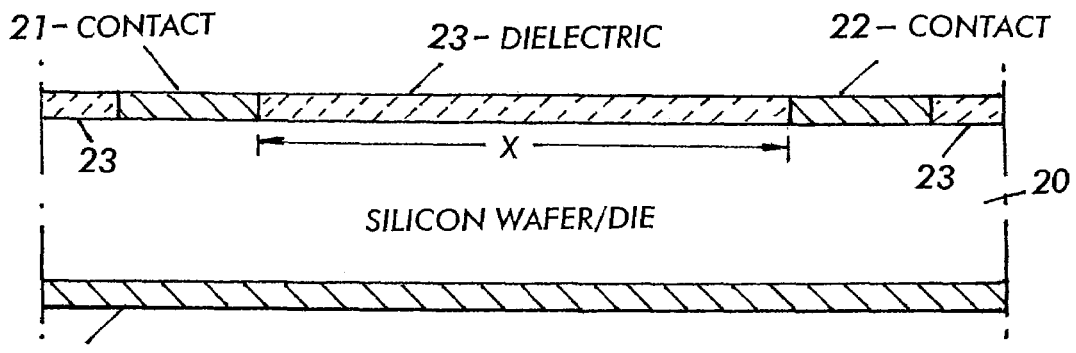
FIG. 1 shows a known type of semiconductor wafer which may be of silicon and which has been fabricated to contain the junctions desired and contacts which are separated by a dielectric.

Referring first to FIG. 1, there is shown a portion of a known type of silicon wafer 20 (or a resulting die singulated therefrom). Note that the invention is applicable, to any type of semiconductor material such as SiC, GaN or the like in which a layer of thick metal such as aluminum is to be etched to separate it into laterally spaced segments. Note that similar components in the various Figures use the same numeral to identify similar elements.

The wafer 20 has been processed in a conventional wafer fabrication procedure to produce the desired junction patterns (not shown) to form desired components such as MOSFETs, IGBTs, diodes, ICs and the like. The top surface of wafer 20 will have at each die location contacts such as contacts 21 and 22 for example and a passivation dielectric layer 23 laterally between contacts 21 and 22. A further contact 24 may also be applied to the bottom of the wafer 20.

The contacts 21 and 22 are to receive a thick metal electrodes, to enable a high current capacity to the die. Thus, the contacts need to be spaced by a distance necessary to allow for lateral underetching if a wet etch process is to be used. Thus, in FIG. 1, the contacts 21 and 22 are spaced by a distance "X" which can, for example, be 16 μm if an 8 μm thick metal electrode layer is to be used.

In the first step of the prior art process, a thick metal layer 30 is first applied, as by sputtering, and a photoresist 31 is applied atop metal layer 30. The photoresist is then processed to define an etch window 32 of any desired topology in a conventional manner.

Metal layer may be aluminum having a thickness of 8 μm. However, any other suitable metal or alloy can be used. Further, any desired thickness can be selected which in general, will be much thicker than the thickness of contacts 21, 22 which may also be aluminum, or aluminum with a small percentage of silicon, as normally used in semiconductor devices.

Figure 2:
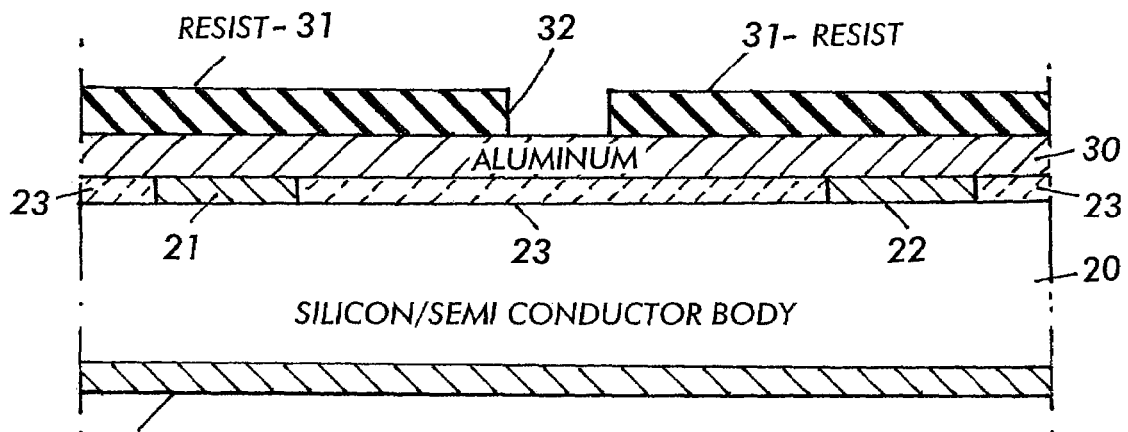
FIG. 2 shows the wafer of FIG. 1 after the application of a thick metal contact for the wafer contacts and a photoresist to its top surface where the photoresist has been processed to open an etch window.

In the next process step in FIG. 2 a conventional wet etch step is carried out, etching the metal 30 through window 30 to the surface of the dielectric 23. There will be a considerable lateral under etch during this process (related as well known to the depth of the etch) to space the laterally separated segments 30a and 30b of the original layer 30. This underetch requires a large spacing "X" between contacts 21 and 22 to insure appropriate contact of the segments 30a and 30b to the contacts 21 and 22. (The spacing "X" is exaggerated for clarity.) This in turn wastes silicon area on the wafer 20.

Figure 4:
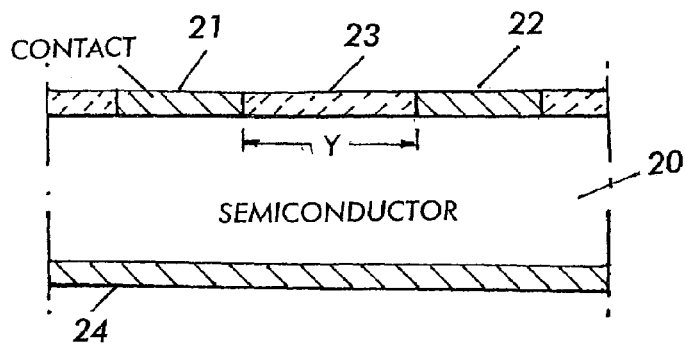
FIG. 4 shows the wafer of FIG. 1 wherein the contacts are spaced by a distance "Y" which is smaller than their spacing "X" in FIG. 3, as a result of the novel processing technique of the invention.
Figure 5:
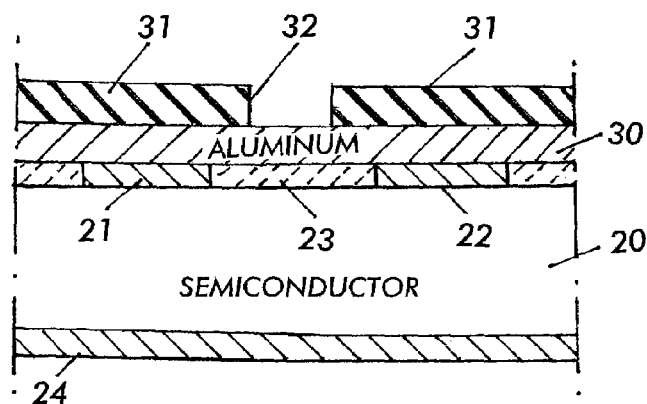
FIG. 5 shows the application of a thick metal layer and a photoresist on the wafer of FIG. 4.

FIG. 4 shows the starting wafer like that of FIG. 1, when using the process of the invention.

The starting wafer of FIG. 4 differs from that of FIG. 1 in that contacts 21 and 22 may be closer, spaced by a distance "Y" which is less than spacing in FIG. 1.

The wafer of FIG. 4 is first processed as in the step of FIG. 2 by sputtering the thick metal layer 30 atop the wafer 20, followed by a photoresist step, forming resist 31 with window 31. Note that window 31 may have any desired topology, such as a stripe, a segment of an arcuate shape, or the like.

Figure 6:
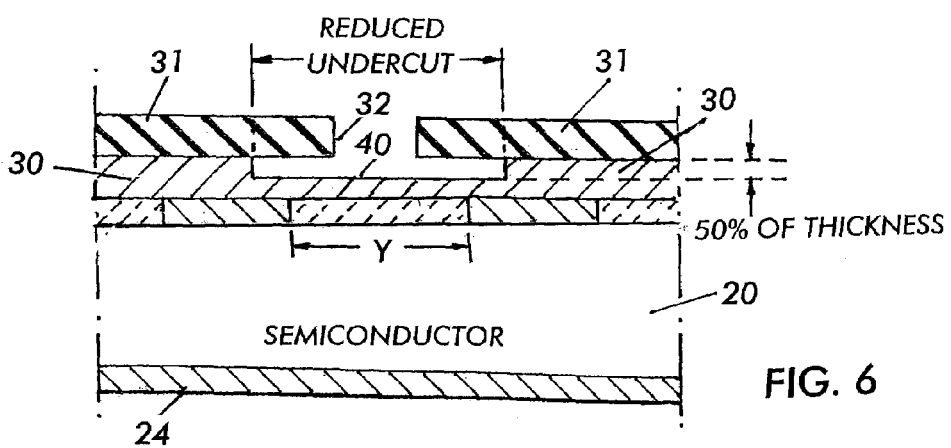
FIG. 6 shows a partial wet etch of the thick aluminum layer of FIG. 5, in accordance with the invention and the resulting limited lateral etch under the photoresist.

In accordance with an important feature of the invention, and as shown in FIG. 6 a wet etch is carried out to etch only a portion of the thickness of layer 30, for example, 80% of the thickness, but more than about 50% of the thickness of layer 30, leaving a web 40 of the metal 30. The lateral under cut will then be appropriately reduced in width.

Figure 3:
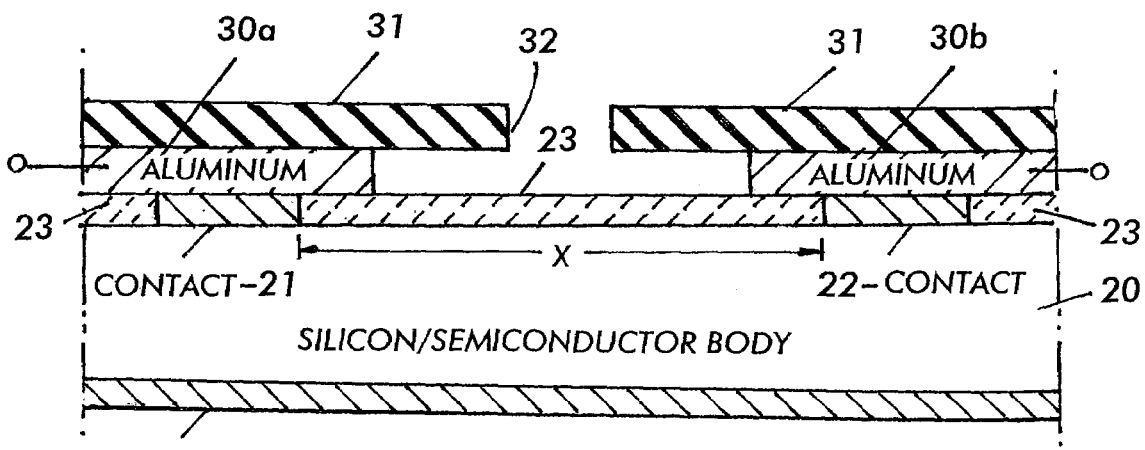
FIG. 3 shows the wafer of FIG. 2 after a wet etch operation to separate the thick metal layer into two insulated electrodes in a prior art process.
Figure 7:
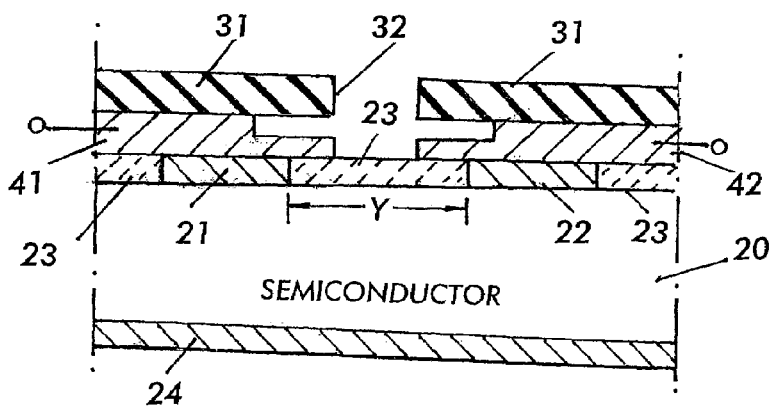
FIG. 7 shows the final process step in which the thin web of the thick aluminum layer is etched by a dry etch, masked by the overhanging photoresist.

Thereafter, and as shown in FIG. 7, a dry etch is carried out, using the gap 32 in the now overhanging sections of the photoresist 31, thereby etching away the defined area, corresponding to gap 32, of the remaining web 40 of metal layer 30 down to dielectric 31. This then finally separates the thick metal layer 30 into its two segments 41, 42 connected to the contacts 21 and 22. Contacts 21 and 22 are spaced by the distance "Y", smaller than "X" in FIG. 3, thus preserving silicon area of wafer 20.

Figure 8:
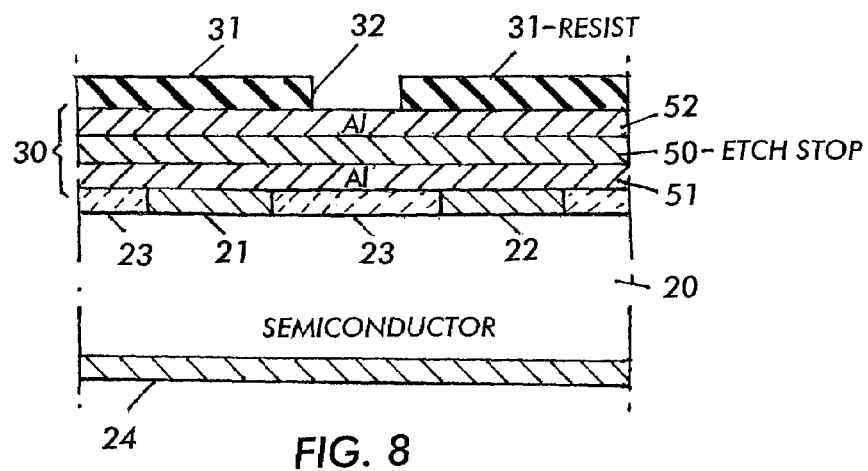
FIG. 8 shows a wafer like that of FIG. 5 in which a wet etch stop layer is added to the thick metal layer, in accordance with the invention.
Figure 9:
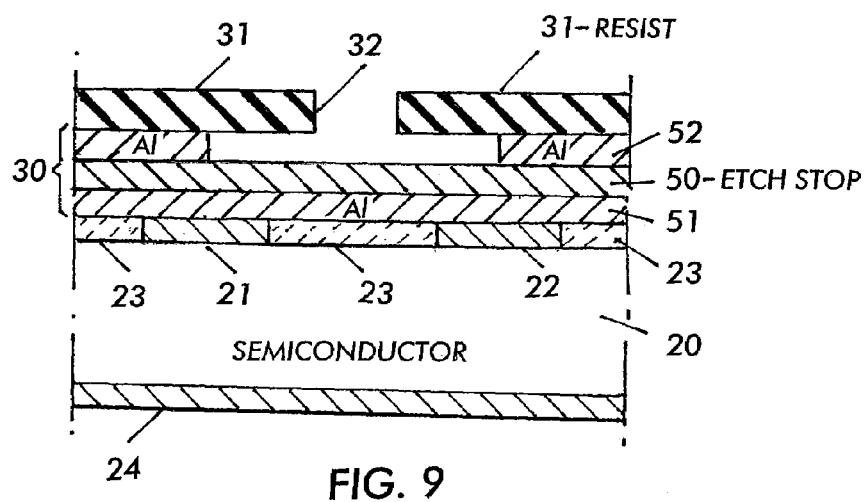
FIG. 9 shows the initial wet etch of the thick metal layer of FIG. 8 down to the etch stop layer.
Figure 10:
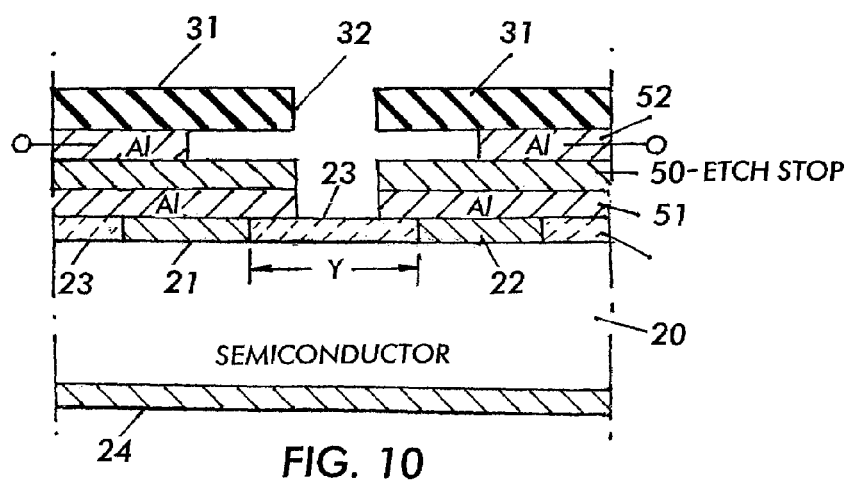
FIG. 10 shows the final etch, by a dry etch process of the remaining web of the thick metal layer and the overlying etch stop layer.

FIGS. 8, 9 and 10 show a second embodiment of the invention. Thus, in FIG. 8, the thick metal layer 30 contains an etch stop layer 50 which is of a conductive material which is resistive to the wet etch used in the step of FIG. 6. In a preferred embodiment, the thick metal layer 30 of FIG. 2 is formed by a first sputtered layer 51 of aluminum of thickness about 1 μm; followed by the deposition or sputtering of a thin titanium or titanium nitride layer 50 for example, 100 Å to 1000 Å, followed by a second aluminum layer 52 of about 7 μm thick. Note that these dimensions are not critical. The photoresist is then formed atop layer 52 and patterned to define wet etch window 32.

As shown in FIG. 9, a wet etch step is carried out as in FIG. 6, but is stopped at a controlled depth by etch stop layer 50.

The remaining web of thick metal layer 30, now consisting if layers 50, 51, 52, is then dry etched through window 32 and removed.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for cutting through the thickness of a metal layer supported atop a substrate support; said metal layer including a first portion, a second portion, and a conductive etch stop layer between said first portion and said second portion; said process comprising the steps of first wet etching a gap into said metal layer through said first portion thereof, and thereafter dry etching through said conductive etch stop layer and said second portion of said metal layer to fully open a gap in said metal layer down to the surface of said substrate support, said conductive etch stop layer being capable of preventing said wet etching from reaching said second portion.

2. The process of claim 1, which further includes the step of forming a photoresist mask atop the surface of said metal layer and opening an etch window in said photoresist mask; both said wet etch step and said dry etch step being carried out through said window.

3. The process of claim 1, wherein said substrate comprises a semiconductor wafer having contact surfaces disposed on opposite sides of said gap and connected to respective ones of the separated segments of said metal layer.

4. The process of claim 1, wherein said etch stop layer comprises titanium.

5. The process of claim 1, wherein said etch stop layer comprises TiN.

6. The process of claim 1, wherein said first and second portions comprise Aluminum.

7. The process of claim 1, wherein said step of wet etching is carried out to etch at least 50% of the thickness of said metal layer.

8. The process of claim 7, wherein said metal layer is about 8 μm thick.

9. The process of claim 7, wherein said substrate comprises a semiconductor wafer having contact surfaces disposed on opposite sides of said gap and connected to respective ones of the separated segments of said metal layer.

10. The process of claim 1, wherein said dry etch step forms a gap of width which is less than the width of this said gap formed by said wet etch step.

11. The process of claim 10, wherein said substrate comprises a semiconductor wafer having contact surfaces disposed on opposite sides of said gap and connected to respective ones of the separated segments of said metal layer.

* * * * *